United States Patent

[19]

Zinn

[11] 3,942,132
[45] Mar. 2, 1976

[54] COMBINED ELECTRON BEAM SEMICONDUCTOR MODULATOR AND JUNCTION LASER

[75] Inventor: Mortimer H. Zinn, Elberon, N.J.

[73] Assignee: The United States of America as represented by the Secretary of the Army, Washington, D.C.

[22] Filed: Sept. 6, 1974

[21] Appl. No.: 504,002

[52] U.S. Cl. ............... 331/94.5 H; 330/33; 330/44; 331/94.5 M; 357/16; 357/18; 357/19; 357/29
[51] Int. Cl.² .................... H01S 3/10; H01S 3/19
[58] Field of Search ....... 330/33, 44; 315/3; 357/19, 357/29, 18, 16, 30; 313/94; 331/94.5 H, 94.5 M

[56] References Cited
UNITED STATES PATENTS
3,283,160  11/1966  Levitt et al. .................... 357/19

OTHER PUBLICATIONS

Wagner, "EBS Application to Laser Pulsing," IEEE Journal of Quantum Electronics, Vol. QE –9, pp. 606–607, June 1973.

Schade et al.,"GaAs–(AlGa)As Cold–Cathode Structure," Applied Physics Letters, Vol. 20, No. 10, 15 May 1972, pp. 385–387.

Primary Examiner—William D. Larkins
Attorney, Agent, or Firm—Nathan Edelberg; Robert P. Gibson; Daniel D. Sharp

[57] ABSTRACT

A combined pulse modulated laser in which a modulated cold cathode device is utilized to excite a combined electron beam bombarded semiconductor device grown integrally with a crystal laser to achieve modulation of the laser output with fast rise and fall times under low voltage and high current conditions.

8 Claims, 8 Drawing Figures

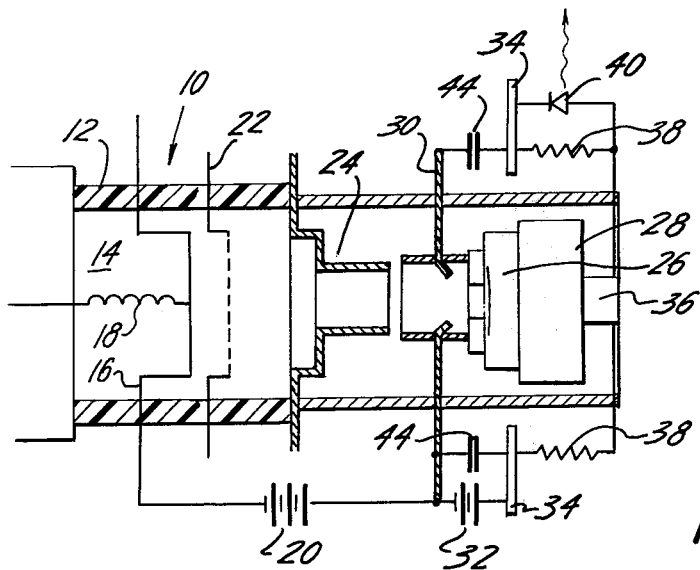
FIG. 1
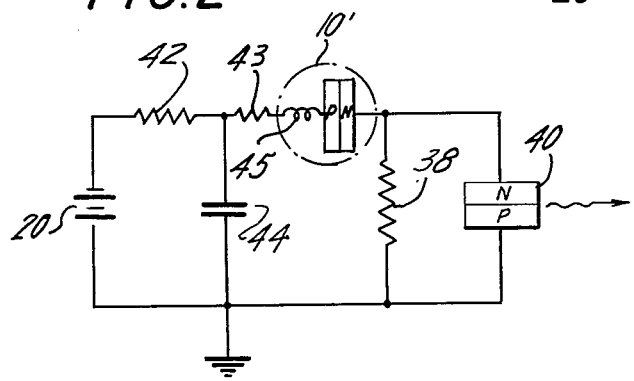
FIG. 2
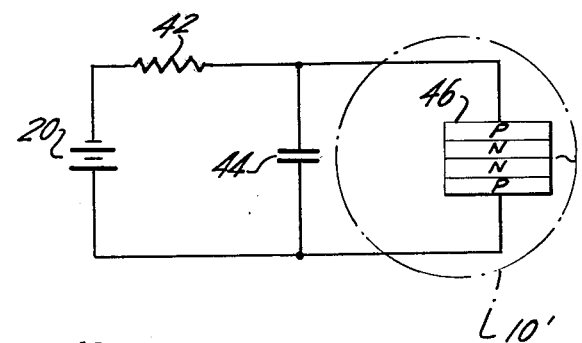
FIG. 3
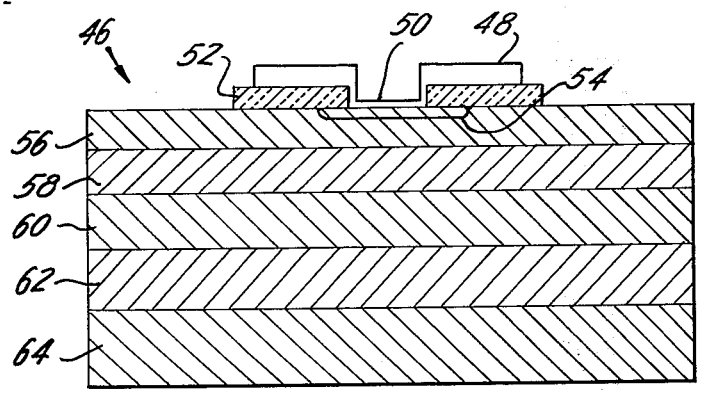
FIG. 4
FIG. 5

COMBINED ELECTRON BEAM SEMICONDUCTOR MODULATOR AND JUNCTION LASER

The Invention described herein may be manufactured and used by or for the Government for governmental purposes without the payment of any royalty thereon or therefor.

BACKGROUND OF THE INVENTION

Solid state lasers of the electron injection type using GaAs, $Ga_{1-x}Al_xAs$ and $GaAs_xP_{1-x}$ have been available for a number of years and have been considered as possible transmitters of communication and data signals for line of sight usage. They are particularly useful in digital communication systems operating at high bit rates. The bit rate is limited, however, by the duty capabilities of the lasers which, in turn, are limited by the time of rise and fall that can be obtained from nanosecond pulse modulators at the low voltage, high current requirements of the lasers. Consideration has been given to utilizing electron beam bombarded semiconductors as part of the pulse modulator to generate the high currents at low impedances required to control the laser with fast rise times. However, electron beam bombarded semiconductor devices are difficult to utilize with a laser in that it is difficult to provide a low inductance, low line impedance connection from the output of the electron beam bombarded semiconductor pulse modulator to the laser diode. The diode lead out of the vacuum envelope of the electron beam bombarded semiconductor device together with the laser diode leads and the effective inductance of the annular bus in such a system limits the rise times achievable. The thermionic cathode in the vacuum envelope of the device also leads to problems. If the pulse modulator laser combination is used in a voice or data communications system and voice or data activated transmission is desired, it is necessary that the thermionic cathode remain on 100% of the time that the transmitter could be in operation. This leads to reduced lifetime and wasted power and prevents practical usage of the device since, in voice or data activated systems, it is necessary for the transmitter to be ready to be turned on all of the time. Thus, a solid state system would be desirable. However, since solid state cannot achieve the pulse modulation requirement needed, the alternative is to use a combination pulse modulator-laser device.

SUMMARY OF THE INVENTION

The problem of obtaining fast rise time in a pulse modulated solid state laser is achieved by combining an electron beam bombarded semiconductor device with a laser diode. This combination semiconductor device is then utilized within a vacuum envelope and bombarded by electron beams from a cold cathode pulse modulated emitter. The cold cathode emitter may be either the Cesiated surface negative affinity type or a non-active surface negative electron affinity material such as $SnO-SnO_2$ system, or any other cold cathode source.

Although this invention will be described with respect to its preferred embodiments, it should be understood that many variations and modifications will be obvious to those skilled in the art, and it is preferred, therefore, that the scope of the invention be limited, not by the specific disclosure herein but only by the appended claims.

DETAILED DESCRIPTION OF THE DRAWINGS

FIG. 1 is a cross-sectional view of a prior art pulse modulator with an internally positioned electron bombarded semiconductor and an external laser diode.

FIG. 2 is the equivalent circuit for the output section of the prior art tube of FIG. 1.

FIG. 3 is the equivalent circuit of the combined electron beam bombarded semiconductor and laser diode positioned internal to the tube in accordance with the principles of the present invention.

FIG. 4 is a cross-sectional view of a combined electron beam semiconductor and laser diode built in accordance with the principles of the present invention.

FIG. 5 is a cross-sectional view of an alternative embodiment of the present invention.

Figure 6:
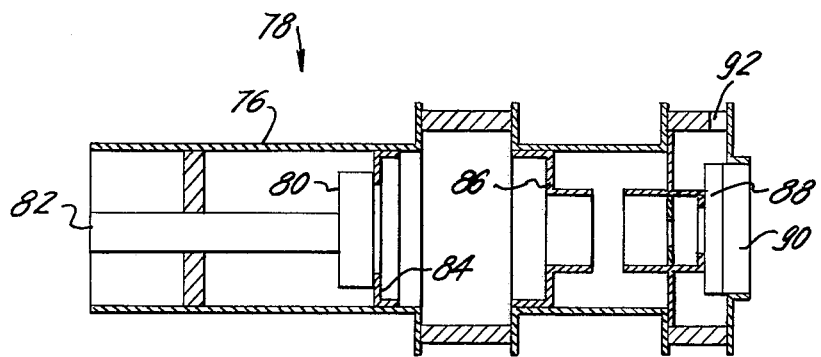
FIG. 6 is a cross-sectional view of a cold cathode combined electron beam semiconductor and laser diode built in accordance with the principles of the present invention.

In FIG. 1, there is shown prior art electron beam bombarded semiconductors utilizing thermionic cathodes in which a laser is externally connected and modulated by the electron beam bombarded semiconductor device. In FIG. 1, the device 10 is shown having a main body 12 which maintains a vacuum within the inside 14 thereof. A heated cathode 16 is heated by a suitable heater 18 and connected to a high voltage source (10–15 KV) 20. The cathode is modulated by a grid 22 from an external source. A suitable focusing shield 24 is provided for focusing the beam from the cathode 16 which has been modulated by the grid 22. The beam is focused on an electron beam bombarded semiconductor device 26. This type of device is well-known in the art and ordinarily consists of a metallized contact mounted over a P-barrier consisting of GaAs and an N-layer of GaAs although it will be understood that other known electron beam bombarded semiconductor devices have been utilized in this type of apparatus. The electron beam semiconductor device 26 is suitably mounted upon a heat sink 28. An annular bus ring 30 is connected to the metallized contact of the diode 26 and has connected thereto one terminal of a low voltage supply (50–200V) 32. The other terminal of the low voltage supply 32 is connected to an annular grounded conducting ring 34. Suitable capacitors are placed between the bus ring 30 and the conducting ring 34. The end of the device 10 has a suitable contact 36 connected to the base of the electron beam bombarded semiconductor device 26 and between the contact 36 and the conducting ring 34 are placed in parallel, resistors 38 and semiconductor laser 40.

The equivalent circuit of the output section of the apparatus shown in FIG. 1 is set forth in FIG. 2. Thus, the low voltage source 20 with its source impedance 42, feeds through the lead resistance 43 and lead inductance 45 to electron beam bombarded semiconductor device 26 and thence to laser 40. Capacitors 44 are connected across the low voltage source 20 and resistors 38 are connected across laser 40. The resistors 38 are placed across the laser 40 for matching purposes. The annular rings 30 and 34 are provided to achieve low inductance. However, even with this construction, it is very difficult to generate the high current at low impedances with fast rise and fall time as is required in digital communication systems operating at high bit rates. To meet the pulse requirements of most lasers, a large area diode must be used as the electron beam bombarded semiconductor device. The leads of this electron beam bombarded semiconductor device out of the vacuum envelope together with the laser diode leads and the effective inductance of the annular buses limit the rise times achievable. To increase the rise time capabilities so that the fundamental limits of electron beam bombarded semiconductor device itself could be approached, it is the purpose of the present invention to combine said electron beam bombarded semiconductor diode with the laser diode in a single structure. The circuit equivalent to that shown in FIG. 2 of such a single structure device is shown in FIG. 3. In FIG. 3, the vacuum envelope is designated in dotted lines as 10'. Within the vacuum envelope 10', there is provided a PNNP device 46 which is a combined electron beam bombarded semiconductor device and laser. In parallel with the device 46 is capacitor 44 which is also across low voltage source 20 and resistor 42.

While it is within the contemplation of the present invention to grow a GaAs or one of its variants as a laser diode on a silicon substrate, and such a combination is within the scope of this disclosure, the preferred embodiment is shown in FIG. 4.

In FIG. 4, the device 46 is shown as comprising a metallized contact 48 which is cup-shaped, it has a circular depressed area 50. The metallized contact 48 rests on an annular insulator 52 and enables the contact 48 to be connected into the circuit. The contact 48 provides contact to an area doped as a P-area of GaAs designed by tne numeral 54. The P-area 54 forms a junction with an $N^-$ area 56. The $N^-$ area 56 is formed of GaAs and is grown on top of the $N^+$ area 58 also from GaAs. The layers 54, 56 and 58 are the electron beam bombarded semiconductor device and are grown on top of another N-layer 60 of $Ga_xAl_{1-x}As$. The final layer 62 is a P-area formed of $Ga_xAl_{1-x}As$. The layer 62 is bonded to an ohmic contact and heat sink 64.

$Ga_xAl_{1-x}As$ crystals can be grown on GaAs crystals so that the materials shown are compatible. Although the active bombarded diode area shown in FIG. 4 is illustrated as being less than that of the laser diode area, this is not necessarily the actual condition. Indeed, the laser crystal may be smaller than the electron beam bombarded semiconductor device or electron beam bombarded active area.

If ohmic shunting of the laser diode is required for proper matching, this can be built in as a support of those areas not occupied by the laser diode leaving open only a region for the passage of the laser light output. This is shown in FIG. 5 wherein there is a large area of electron beam bombarded semiconductor and a small area laser with ohmic shunting of the laser. In FIG. 5, there is shown a device 46' having a metallized contact 48' mounted on an insulator 52'. The metallized contact 48' is cup-shaped and has a depressed area 50' in contact with a P-area 54' of GaAs semiconductor material. This forms a barrier with the $N^-$ area 56' of GaAs.

The layer 56' is grown on a suitable $N^+$ layer 66 formed of GaAs material out of which has been cut a volume 68. Within the volume 68, there is grown the laser crystal consisting of N-area 70 and P-area 72 formed of $Ga_xAl_{1-x}As$. The $N^+$ area 66 has posts or bars 74 which rest upon the ohmic contact and heat sink 64'. Thus, the posts or bars 74 act as ohmic shunts for the $N^+$ area 66 with respect to the laser diode consisting of layer 70 and 72. Layer 70 and 72 extend between the ohmic contact 64' and the layer 66. The posts or bars are positioned so that the light emitted by the laser diode 70, 72 can exit from the semiconductor device.

The PNNP devices 46 and 46' shown in FIGS. 4 and 5 can be mounted in the device shown in FIG. 1 with the only added feature required being a sapphire window sealed into the envelope at an appropriate point. This would eliminate all the external connections which limited the rise and fall times of the prior art devices.

While the device discussed with respect to FIGS. 1 – 5 would make a highly useful device, the fact that it incorporates a thermionic cathode leads to a problem that the present invention is aimed at overcoming. If the pulse modulator-laser combination was to be used in a voice and data communication system and voice or data activated transmission was desired, it would be necessary that the thermionic cathode remain on 100% of the time that the transmitter could be in operation. For voice or data activated systems, an all solid state system is desirable. Since solid state devices cannot achieve the pulse modulation requirements needed, the alternative is to use the combination pulse modulator-laser output diode discussed in FIGS. 3 – 5 in a device similar to that shown in FIG. 1, except that a room temperature electron emitter capable of being modulated using low power solid state devices is substituted for the thermionic cathode presently in use.

The device 78 shown in FIG. 6 includes a vacuum envelope 76 within which is positioned a cold cathode 80 having a contact 82 and being connected to a metallized ring 84 at its outer periphery. A suitable accelerator and focus structure 86 is provided similar to the prior art device shown in FIG. 1 and the combined electron beam bombarded semiconductor and laser device of FIGS. 3 – 5 is positioned as at 88 with the heat sink 90 facing away from the cold cathode. A suitable window 92 is provided in the wall of the vacuum envelope 76 for allowing the pulse modulated light output from the laser to be transmitted outside of the structure of the device 78. The cold cathode 80 is intended to receive a coaxial high data rate input and does not require continuous heating of the cathode as in prior art thermionic cathodes. No life or power wastage problems at high voltage can be expected with these cold cathode devices and, additionally, the cathodes are capable of nanosecond rise and fall times with the coaxial type input shown. Thus, the combined cold cathode pulse modulated laser combination makes an excellent component for high bit rate communication systems.

Figure 7:
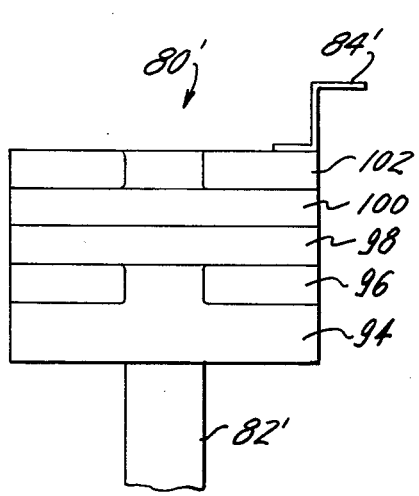
FIG. 7 is a cross-sectional view of an optoelectronic cold cathode utilized in the device shown in FIG. 6.
Figure 8:
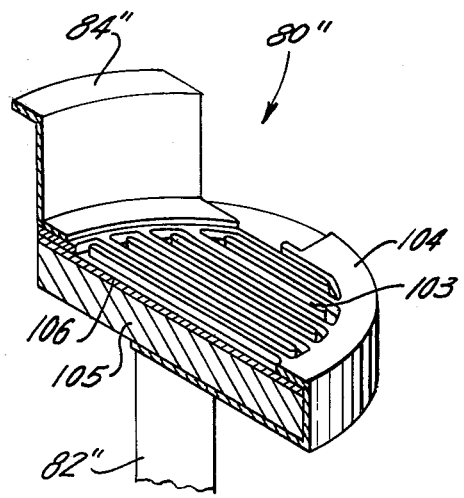
FIG. 8 is an area non-active surface negative electron affinity cold cathode utilized in the device shown in FIG. 6.

The cold cathode beam may be of the types shown in FIGS. 7 and 8. In FIGS. 7 and 8, the cold cathodes 80' and 80'', respectively, each have ohmic contact center conductors 82' and 82'' at one end thereof, and ohmic contact making ohmic contact from the cathode, to the outer conductor 84' and 84'', respectively.

The optoelectronic cold cathode of FIG. 7 is a multilayer device in which the bottommost layer 94 is an $N^+$ layer of GaAs and has an annular ring of GaAs:Zn forming a $P^+$ layer 96 grown thereon. Thence, a layer 98 is grown forming an N-layer of $Ga_xAl_{1-x}As$ and a P-layer grown thereon formed of $Ga_xAl_{1-x}As$ and thence an annular P⁺ layer 102 formed of GaAs:Zn. In the center of a P-layer of GaAs with $CsO_2$ on the surface thereof. Thus the optoelectronic cold cathode is a Cesiated surface negative affinity device capable of controlled emission in accordance with the electrical input applied across contacts 82, 84'.

In FIG. 8, the outer conductor 84'' consists of metallized fingers 103 interdigitated with metallized fingers 104 connected to the ohmic contact 82''. The interdigitated fingers 103 and the fingers 104 are placed on the $SnO-SnO_2$ surface 106 formed on quartz substrate 105 to achieve controlled emission from the cathode in accordance with the electrical input across the center conductor 82'' and the outer conductor 84''.

The optoelectronic cathode of FIG. 7 is straightforward and has been demonstrated to emission densities of 40mA/cm². Only a life in a high voltage environment remains the problem, but this is minimized with a GaAs anode. The $SnO-SnO_2$ system demonstrated in interdigital form can achieve up to 500ma/cm² with 100 fingers per inch. Obviously, other types of cold cathode devices could be utilized within the principles of the present invention.

Although this invention has been described with respect to its preferred embodiments, it should be understood that many variations and modifications will now be obvious to those skilled in the art, and it is preferred, therefore, that the scope of the invention be limited, not by the specific disclosure herein, but only by the appended claims.

I claim as my invention:

1. A pulse modulated laser comprising a semiconductor device having a portion thereof bombarded by an electron beam and a semiconductor laser diode grown on said semiconductor device to form a monolithic PNNP structure, said laser diode responding to current flowing within said semiconductor device during beam bombardment thereof.

2. A pulse modulated laser according to claim 1 wherein said semiconductor laser is formed of $Ga_xAl_{1-x}As$.

3. A pulse modulated laser according to claim 2 wherein said semiconductor device is formed of GaAs.

4. A pulse modulated laser according to claim 1 further including an electrical contact means connected to said laser diode.

5. A pulse modulated laser according to claim 4 wherein said laser diode contacts an inner region of said electrical contact means and said semiconductor device comprises ohmic shunting means for said laser device formed by a peripheral extension of said semiconductor device contacting a region of said electrical contact means spaced from said inner region.

6. A pulse modulated laser according to claim 1 further including a pulse modulated cathode directly modulated by applied electrical signals for producing the electron beam.

7. A pulse modulated laser according to claim 6 further including a vacuum envelope within which is disposed said cathode, said semiconductor laser diode and said semiconductor device.

8. A pulse modulated laser according to claim 1 further including a vacuum envelope within which is disposed said semiconductor laser diode and said semiconductor device.

* * * * *